(12) United States Patent
Higuchi et al.

(10) Patent No.: US 8,227,733 B2
(45) Date of Patent: Jul. 24, 2012

(54) COMBINED PHOTOELECTRIC CONVERSION DEVICE

(75) Inventors: Hisashi Higuchi, Shiga (JP); Junji Aranami, Shiga (JP); Hisashi Sakai, Shiga (JP); Riichi Sasamori, Shiga (JP); Seigo Ito, Shiga (JP)

(73) Assignee: KYOCERA Corporation, Kyoto (JP)

( * ) Notice: Subject to any disclaimer, the term of this patent is extended or adjusted under 35 U.S.C. 154(b) by 580 days.

(21) Appl. No.: 12/415,712

(22) Filed: Mar. 31, 2009

(65) Prior Publication Data

US 2010/0243863 A1 Sep. 30, 2010

(51) Int. Cl.
*G01J 1/44* (2006.01)

(52) U.S. Cl. ........... 250/206; 250/214.1; 250/208.1; 136/252; 257/E31.126

(58) Field of Classification Search ............. 250/214.1, 250/206, 208.1, 208.2; 136/252, 256; 257/431, 257/E31.126
See application file for complete search history.

(56) References Cited

U.S. PATENT DOCUMENTS

2008/0210296 A1* 9/2008 Morooka et al. ............. 136/252

FOREIGN PATENT DOCUMENTS

JP 2002-231324 8/2002

* cited by examiner

*Primary Examiner* — Kevin Pyo
(74) *Attorney, Agent, or Firm* — Procopio, Cory, Hargreaves & Savitch LLP

(57) ABSTRACT

A multi-layer photoelectric conversion device and technology is disclosed. A first photoelectric converter is separated from a second photoelectric converter by an insulative layer. The photoelectric converters may be of a variety of types, and the insulative layer provides protection to reduce pinhole faults in the multi-layer photoelectric conversion device.

16 Claims, 4 Drawing Sheets

COMBINED PHOTOELECTRIC CONVERSION DEVICE

RELATED APPLICATION

The present application is related to Japanese patent application serial number JP2007-047744, filed on Feb. 27, 2007, Japanese patent application serial number JP2007-171027, filed on Jun. 28, 2007 and Japanese patent application serial number JP2008-046224, filed on Feb. 27, 2008, each of which is incorporated herein by reference in its entirety.

FIELD OF INVENTION

Embodiments of the present disclosure relate generally to a photoelectric conversion device, and more particularly relate to a multi-layer photoelectric conversion device.

BACKGROUND OF THE INVENTION

A known structure of a composite solar battery, includes a dye-sensitized solar cell arranged on a light-incident surface side, and a crystalline silicon solar cell arranged on the side opposite to the light-incident surface of the dye-sensitized solar cell (i.e., on a rear side). According to this structure, the dye-sensitized solar cell can make use of short wavelengths of sunlight and the crystalline silicon solar cell can make use of longer wavelengths of the sunlight.

However, this composite solar battery has a structure wherein the two independent solar cells are combined one on top of the other; therefore, wiring is required to connect the individual solar cells to each other. As a result, the battery production process may be complex, and the photoelectric conversion efficiency low.

Furthermore, for thin-film photoelectric conversion devices small holes may develop in the surface caused by manufacturing defects. These small holes are often referred to as "pinholes" or "pinhole defects". These pinholes may cause leakage currents that decrease the efficiency and output of thin-film photoelectric conversion devices.

Therefore, there is a need for combined photoelectric conversion devices with high photoelectric conversion efficiency, which may be produced easily and minimizes defects from pinhole defects.

SUMMARY

A multi-layer photoelectric conversion device and technology is disclosed. A first photoelectric converter is separated from a second photoelectric converter by an insulative layer. The photoelectric converters may be of a variety of types, and the insulative layer provides protection to reduce pinhole faults in the multi-layer photoelectric conversion device.

A first embodiment comprises a photoelectric conversion device comprising a laminated structure. The laminated structure comprises a first photoelectric converter comprising a thin-film photoelectric converter, and a first conductive layer thinner than the first photoelectric converter. The laminated structure further comprises a second conductive layer comprising a material higher in electric resistivity than the first conductive layer, and a second photoelectric converter.

A second embodiment comprises a combined photoelectric conversion device comprising a laminated structure. The laminated structure comprises a first photoelectric converter comprising a pinhole, and a first conductive layer thinner than the first photoelectric converter. The laminated structure further comprises a second conductive layer comprising a material higher in electric resistivity than the first conductive layer, and a second photoelectric converter.

A third embodiment comprises a method for producing a combined photoelectric conversion device. The method comprises forming a first photoelectric converter on a first substrate, and forming a second photoelectric converter on a second substrate. The method further comprises interposing a first conductive layer and a second conductive layer located between the first photoelectric converter and the second photoelectric converter; and combining the first photoelectric converter and the second photoelectric converter.

A fourth embodiment comprises a method for producing a combined photoelectric conversion device. The method comprises forming a first photoelectric converter on a first substrate, and forming a second photoelectric converter on a second substrate. The method further comprises forming a first conductive layer on the first photoelectric converter, and forming a second conductive layer on the first conductive layer. The method also comprises combining the first photoelectric converter and the second photoelectric converter, wherein the first conductive layer and the second conductive layer are located between the first photoelectric converter and the second photoelectric converter.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

DETAILED DESCRIPTION OF EXEMPLARY EMBODIMENTS

The following description is presented to enable a person of ordinary skill in the art to make and use the embodiments of the disclosure. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the invention. Thus, embodiments of the present disclosure are not intended to be limited to the examples described herein and shown, but are to be accorded a scope consistent with the claims.

Embodiments of the disclosure are described herein in the context of a practical non-limiting application, namely, use as a solar cell. Embodiments of the disclosure, however, are not limited to such solar cell applications, and the techniques described herein may also be utilized for other of devices and applications. For example, embodiments may be applicable to power portable electronic devices using room lighting and the like.

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present invention. For the sake of brevity, conventional techniques and components related to mobile phones and other functional aspects of portable electronic devices and the individual operating components of a device may not be described in detail herein.

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present disclosure.

Figure 1:
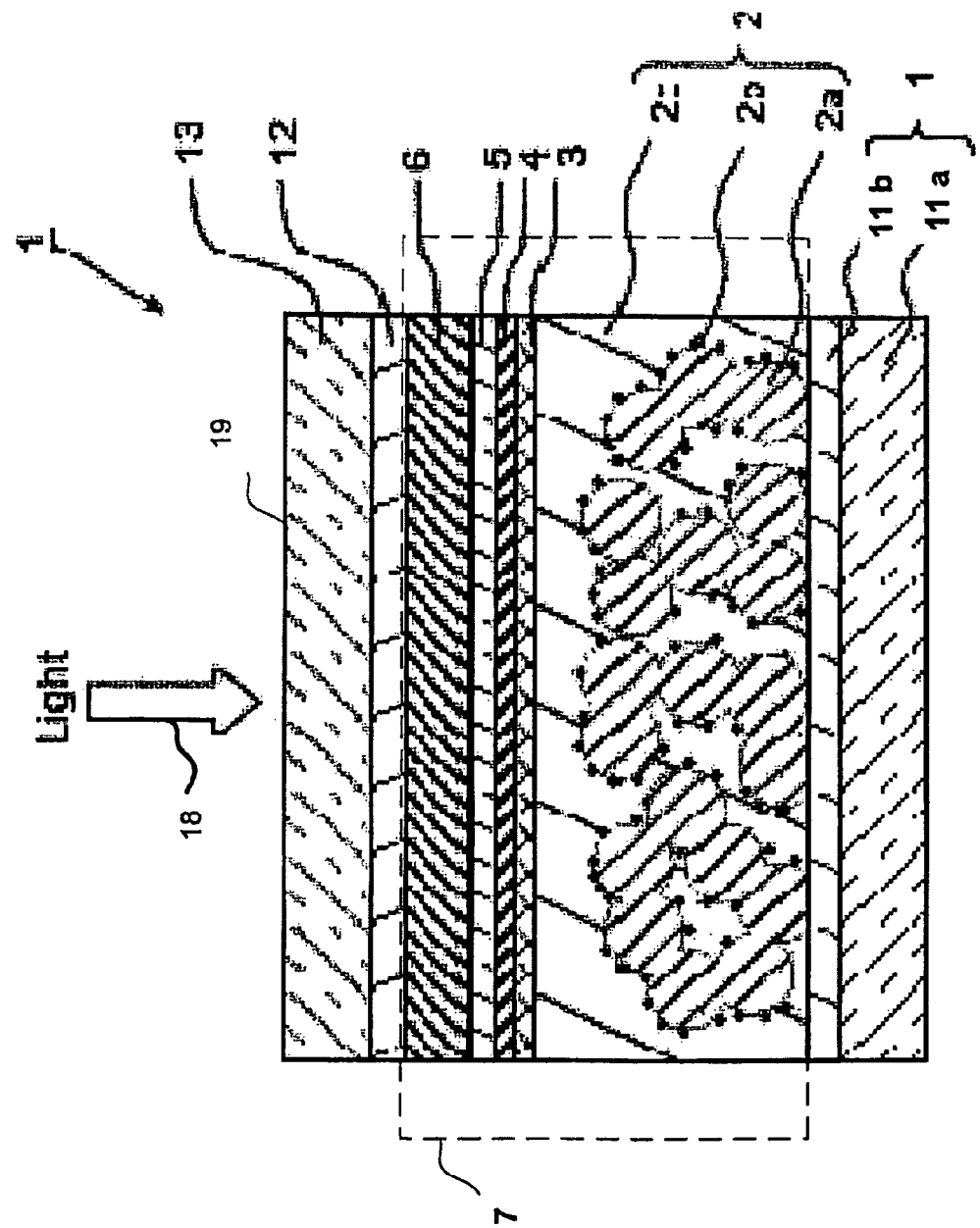
FIG. 1 is a sectional view illustrating an exemplary combined photoelectric conversion device according to an embodiment of the disclosure.

FIG. 1 is a sectional view illustrating an exemplary combined photoelectric conversion device 1 according to an embodiment of the disclosure. The combined photoelectric conversion device 1 (device 1) comprises a translucent cover 13, a translucent electroconductive layer 12, a laminated structure 7, and an electroconductive substrate 11. The translucent cover 13 is located on the translucent electroconductive layer 12, and the translucent electroconductive layer 12 is located at an upper region of device 1. The laminated structure 7 is located between the translucent electroconductive layer 12 and the electroconductive substrate 11. The electroconductive substrate 11 is located at a bottom plane of the combined photoelectric conversion device 1. An arrow shows a direction of light 18 radiated into the combined photoelectric conversion device 1. In the present embodiment, the word "translucency or translucent" means a material where 5% or more of incident light energy is transmitted.

The translucent cover 13 protects a first photoelectric converter (thin-film photoelectric converter) 6. The material of the translucent cover 13 may be, without limitation, an organic material, an inorganic material, or an organic/inorganic hybrid material. The thickness of the translucent cover 13 is from about 0.1 μm to about 6 mm, preferably from about 1 μm to about 4 mm. In one embodiment, the translucent cover 13 is made for use as a support. In this case, the thin-film photoelectric converter 6 may be formed in advance with the thickness of the translucent cover 13 preferably from about 0.05 to about 2 mm, more preferably from about 0.1 to about 1 mm to provide sufficient mechanical strength. The light-incident side surface 19 of the translucent cover 13 may be, without limitation, a flat surface, or a surface having irregularities having a size in the order of wavelengths of incident light so as to produce a light-confining effect.

The translucent electroconductive layer 12 removes electric currents generated from the second photoelectric converter 2 and the first photoelectric converter 6. The translucent electroconductive layer 12 may be, without limitation, an ITO layer or impurity-doped $In_2O_3$ layer formed by low-temperature-growing sputtering method or a low-temperature spray thermal decomposition method; an impurity-doped ZnO layer formed by a solution growing method; a fluorine-doped tin dioxide layer ($SnO_2$:F layer) formed by thermal CVD method; and the like. These layers may be used in a form of a lamination comprising two or more layers.

The translucent electroconductive layer 12 may be formed by a different forming method such as, without limitation, vacuum evaporation method, ion plating method, dip coating method, a sol-gel method, or some other film-forming method. When surface irregularities having a size in the order of the wavelengths of incident light are formed by the film-forming method, light-confining effect can be obtained. The translucent electroconductive layer 12 may be, without limitation, a light-transmissible thin metal layer made of Au, Pd, Al or the like and formed by, without limitation, vacuum evaporation method, sputtering method, and the like.

The laminated structure 7 comprises the thin-film photoelectric converter (first photoelectric converter) 6, a first electroconductive layer 5 thinner than the first photoelectric converter 6, a high-resistivity second electroconductive layer 4 made of a material higher in electric resistivity than the first electroconductive layer 5, a third electroconductive layer 3, and a dye-sensitized photoelectric converter (second photoelectric converter) 2. As used herein "thin-film photoelectric converter" means a solid photoelectric converter having a thickness of about 10 μm or less. According to an embodiment, the donation and acceptance of electrons between the second photoelectric converter 2 and first photoelectric converter 6 can easily be attained by interposing the third electroconductive layer 3, the high-resistivity second electroconductive layer 4 and the first electroconductive layer 5 therebetween, as described above. Thus, wiring for connecting the second photoelectric converter 2 and first photoelectric converter 6 is unnecessary so that the production process becomes simpler and the photoelectric conversion efficiency becomes high.

The first photoelectric converter 6 of the present embodiment is a thin-film photoelectric converter, and has translucency. The first photoelectric converter 6 preferably has a thickness of about 10 μm or less in order to transmit light satisfactorily. The thin-film photoelectric converter 6 is, for example, a non-monocrystalline photoelectric converter layer.

The non-monocrystalline photoelectric converter layer may be an amorphous-silicon-based pin junction thin film, or a compound-semiconductor-based junction thin film, the compound semiconductor being, for example, CIGS (CuInGaSe). The junction layer is preferably a pin junction type, pn junction type, Schottky junction type or heterojunction type layer, or any other type of layer wherein an internal electric field is generated.

In one embodiment, non-monocrystalline photoelectric converter layer is an amorphous-silicon-based layer, and preferably is an amorphous-silicon-based layer, amorphous-silicon-based material containing a nano-size crystal, or fine-crystalline-silicon-based layer. In particular, an amorphous-silicon-based layer containing an amorphous-silicon-based material having short-wavelength sensitivity, or a nano-size crystal wherein optical deterioration is restrained is preferred. Herein "amorphous-silicon-based" also means, "amorphous-silicon-alloy-based", such as that of "amorphous-silicon-carbide-based" or "amorphous-silicon-nitride-based".

The thickness of the non-monocrystalline photoelectric converter layer is preferably at most about 350 nm (0.35 μm). In this manner, the light transmittance of the non-monocrystalline photoelectric converter layer is improved so that the photoelectric conversion efficiency of the combined photoelectric conversion device 1 is improved.

The non-monocrystalline photoelectric converter layer that is an amorphous Si thin film or the like preferably comprises an uneven (or irregular) structure having a light-confining effect in the interface between the non-monocrystalline photoelectric converter layer and the translucent electroconductive layer 12 described above. This makes it possible to restrain optical reflection satisfactorily. The uneven structure is a structure having an arithmetic average roughness of about 0.01 to about 0.5 µm.

In the present embodiment, the peak wavelength of the spectral sensitivity of the second photoelectric converter 2 is different from that of the first photoelectric converter 6. This makes it possible to attain photoelectric conversion of light rays in a wide wavelength band efficiently when light transmitted through one of the photoelectric converters is absorbed into the other and then photoelectrically converted. Specifically, short-wavelength light rays (about 300 to 700 nm) are photoelectrically converted satisfactorily by the thin-film photoelectric converter 6 while long-wavelength light rays (about 700 to 950 nm) and short-wavelength light rays transmitted through the thin-film photoelectric converter 6 are photoelectrically converted satisfactorily by the dye-sensitized photoelectric converter 2. Additionally, the thin-film photoelectric converter 6, which is on the light-incident side 19, absorbs short-wavelength light rays well; therefore, short-wavelength light rays hardly reach the dye-sensitized photoelectric converter 2. Thus, the dye-sensitized photoelectric converter 2 is protect from an optical deterioration caused by short-wavelength light rays. Herein, "a material has a spectral sensitivity to specific light rays" means that the material can attain photoelectric conversion when the specific light rays are radiated thereto. Also herein, "a photoelectric converter is translucent" or "a photoelectric converter has translucency" includes an embodiment where the photoelectric converter is translucent to light rays in a wavelength band into which the photoelectric converter does not have any spectral sensitivity. Also, an embodiment is included where incident light rays are not absorbed totally therein, where the light rays are partially transmitted therethrough even when the light rays are light rays of a wavelength band where the photoelectric converter has a spectral sensitivity.

The second photoelectric converter 6 and the first photoelectric converter 2 may each also be appropriately, without limitation, a dye-sensitized photoelectric converter, a crystalline photoelectric converter containing a crystalline silicon layer or the like, an organic photoelectric converter containing an organic semiconductor layer, or an inorganic compound based photoelectric converter containing a CIGS (CuInGaSe) layer or the like. For example, the first photoelectric converter 6 may be changed to a photoelectric converter equal in kind to the second photoelectric converter 2. In this case, the first photoelectric converter 6 is preferably a photoelectric converter having a peak sensitivity into a wavelength range different from the wavelength range to which the second photoelectric converter 2 has a peak sensitivity. In this manner, the combined photoelectric conversion device 1 efficiently attains photoelectric conversion of light rays having a wide wavelength band.

The first electroconductive layer 5 and the third electroconductive layer 3 are each made of an electroconductive material such as, without limitation, at least one selected from platinum group elements such as Pt or Pd, an alloy of a platinum group element, aluminum, silver, or the like. Such a material functions as a catalyst for lowering an overpotential against charge transfer between the second photoelectric converter 2 and the first photoelectric converter 6. As a result, the charge transfer is satisfactorily attained so that the photoelectric conversion efficiency is high. In particular, a platinum group element such as Pt or Pd is preferred since the element is also excellent in corrosion resistance. The first electroconductive layer 5 and the third electroconductive layer 3 may also preferably be made of carbon, and/or electroconductive polymer. These layers are each excellent in adhesion strength and catalytic power, and each make it possible to keep translucent certainly. These may be used in the form of a lamination of two or more thereof. These layers are formed, for example but without limitation, by vacuum-evaporation, sputtering, a thermal decomposition method in which a painted complex is thermally decomposed, or the like.

The electroconductive polymer layer is preferably, without limitation, a film made of a thiophene derivative such as polyethylenedioxythiophene (PEDOT, which may be doped with polystyrene sulfonate or the like), a film made of a carbazole derivative such as polyvinylcarbzole, an aniline derivative or the like. The film is easily formed, and produces advantages that the film is excellent in translucency and the selectivity of a dopant into the film is made high. The third electroconductive layer 3 and the first electroconductive layer 5 when made of electroconductive polymer are, for example, formed by spin coating, electrodeposition method or the like.

The high-resistivity second electroconductive layer 4 comprises a high-resistivity layer. The high-resistivity second electroconductive layer 4 is formed to have a sheet resistivity of about $10^3 \Omega/\square$ (i.e., $\Omega/\square$ is a measure of sheet resistance: ohms/square of resistive sheet area) or more and about $10^{10} \Omega/\square$ or less and cover the first electroconductive layer 5. The high-resistivity second electroconductive layer 4 is made of a material higher in electric resistivity than the third electroconductive layer 3 and the first electroconductive layer 5. This makes it possible to embed the high-resistivity second electroconductive layer 4, which is relatively low in electroconductivity, in gaps in the first electroconductive layer 5 made discontinuous in the pinholes 20 in the first photoelectric converter 6, so as to restrain the second-conductive-type transporter 2 of the second photoelectric converter 2 from entering the pinholes 20. As a result, the short circuit based on the pinholes 20 can be more effectively restrained.

For the high-resistivity second electroconductive layer 4, an electroconductive body or a semiconductor is used. The high-resistivity second electroconductive layer 4 is preferably made of, without limitation, at least one of In2O3, SnO2, ZnO, ITO (Sn-doped In2O3), ZnO:B (B-doped ZnO), ZnO:Ga (Ga-doped ZnO), ZnO:Al (Al-doped ZnO), SnO2:F (F-doped SnO2), SnO2:Sb (Sb-doped SnO2), and TiO2:Nb (Nb-doped TiO2) since a translucent homogeneous film can easily be formed. TiO2:Nb is particularly preferred since the material is high in chemical properties, such as chemical resistance, and has a high refractive index so that the material can be made particularly thin.

The high-resistivity second electroconductive layer 4 may be formed by vacuum evaporation method, ion plating method, sputtering method, electrolytic deposition method or the like. Other examples of the high-resistivity second electroconductive layer 4 include a layer made of polyethylenedioxythiophene (PEDOT, which may be doped with polystyrene sulfonate or the like) and formed by spin coating or the like; and an organic semiconductor layer made of polyvinylcarbazole or the like and formed by electrolytic deposition.

The thickness of the high-resistivity second electroconductive layer 4 is preferably from about 0.001 to about 1 µm, more preferably from about 0.01 to about 0.2 µm. To achieve an effective layer structure of the high-resistivity second electroconductive layer 4 preferably a material with a thickness of at least about 0.001 µm is used. In order to improve the light transmittance thereof and further make charge transfer therein good, preferably a material with a thickness of at most about 1 µm is used.

The thickness of the high-resistivity second electroconductive layer 4 may be selected based on the translucency of the first photoelectric converter 6. In other words, the thickness of the high-resistivity second electroconductive layer 4 for optimizing the transmittance-improving effect based on the high-resistivity second electroconductive layer 4 can be obtained from the refractive index of the high-resistivity-second-electroconductive-layer-4-side material of the first photoelectric converter 6, and the second-electroconductive-layer-4-side material of the second photoelectric converter 2. For example, when using a photoelectric converter composed of amorphous silicon as the first photoelectric converter 6, an acetonitrile solvent as the electrolytic solution of the dye-sensitized photoelectric converter 2, which is the second photoelectric converter 2, and an In2O3:Sn layer as the high-resistivity second electroconductive layer 4, the thickness of the high-resistivity second electroconductive layer 4 is preferably from about 0.07 to about 0.08 μm.

The dye-type second photoelectric converter 2, according to the present embodiment, comprises a dye-sensitized photoelectric converter. The dye-sensitized photoelectric converter is preferred since the converter is easily produced. The dye-sensitized photoelectric converter 2 comprises, for example but without limitation, a porous first-conductive-type (for example, n type) transporter 2a, a permeable second-conductive-type (for example, p type) transporter 2c formed to be embedded into pores in the first-conductive-type transporter 2a, and a dye 2b formed in the interface between the two transporters.

The first-conductive-type transporter 2a has a function of transporting electric charges (for example, electrons) from the dye 2b to the electroconductive substrate 11. The first-conductive-type transporter 2a is preferably, for example but without limitation, a porous body made of an n type metal oxide semiconductor such as titanium dioxide. In this case, the first-conductive-type transporter 2a that has porosity is formed on the electroconductive substrate 11. In one embodiment, the first-conductive transporter 2a is made of titanium dioxide, and the porous first-conductive-type transporter 2a is formed by painting a paste of titanium dioxide powder onto the electroconductive film 11b of the electroconductive substrate 11 and then heating the resultant.

In one embodiment, the first-conductive-type transporter 2a is a porous body, and the area where particles of the powder are joined to each other is increased. Furthermore, the surface area on which the dye 2b is carried is increased, which increases the photoelectric conversion efficiency. Moreover, if the first-conductive-type transporter 2a is a porous body, the surface of the dye-sensitized photoelectric converter 2 may be uneven or have irregularities, and a light-confining effect is given to the dye-sensitized photoelectric converter 2 so that the photoelectric conversion efficiency can be made higher.

The n type metal oxide semiconductor may contain one or more nonmetallic elements such as, without limitation, nitrogen (N), carbon (C), fluorine (F), sulfur (S), chlorine (Cl), phosphorus (P), and the like. This n type metal oxide semiconductor is preferred since the n type metal oxide semiconductor has an electron energy band gap of about 2 eV to about 5 eV, which is larger than the energy of visible rays. Furthermore, the conductive band of the n type metal oxide semiconductor is lower than the conductive band of the dye 2b in their electron energy levels.

The first-conductive-type transporter 2a is preferably a porous body having a porosity of about 20% to about 80%, and is more preferably a porous body having a porosity of about 40% to about 60%. In this manner, the surface area of the optically acting electrode can be increased at least about 1000 times so that light-absorption, electricity-generation and electron-conduction can be effectively attained.

The porous first-conductive-type transporter 2a preferably has a form that is large in surface area and gives a small electric resistance, for example, without limitation, a fine particle form or fine line form. The average particle diameter or average line diameter thereof is preferably from about 5 nm to about 500 nm, more preferably from about 10 nm to about 200 nm. In one embodiment, a material comprising an average particle diameter of the fine particles or the average line diameter of the fine lines of at least about 5 nm is used to make production of a fine material comprising the first-conductive-type transporter 2a easy. For example, a material comprising an average particle diameter or average line diameter of at most about 500 nm is used to make the joint area large to cause a photoelectric current to flow efficiently.

The thickness of the first-conductive-type transporter 2a is preferably from about 0.1 to about 50 μm, more preferably from about 1 to about 20 μm. For example, the photoelectric conversion efficiency can be increased by preferably using a material that has a thickness of at least about 0.1 μm. For another example, the translucency is made higher, by preferably using a material that has a thickness of at most about 50 μm.

The dye 2b is preferably a dye wherein the incident photon-to-current efficiency (IPCE), that is, the so-called spectral sensitivity extends from the absorption threshold wavelength of the thin-film photoelectric converter 6 toward longer wavelengths. This makes it possible to attain efficient photoelectric conversion of light rays having a wide wavelength band by effect of the thin-film photoelectric converter 6 and the dye-sensitized photoelectric converter 2.

For example, an intrinsic amorphous silicon semiconductor is used as the thin-film photoelectric converter 6. In this case, the dye 2b is preferably a dye having a characteristic that its spectral sensitivity extends from the peak sensitivity or the absorption threshold wavelength of the intrinsic amorphous silicon semiconductor toward longer wavelengths. The absorption threshold wavelength of the intrinsic amorphous silicon semiconductor is about 700 nm. The dye 2b may be, for example but without limitation, a dye exhibiting an IPCE in a wavelength band having wavelengths of about 700 nm or more. In this manner, a combined photoelectric conversion device capable of attaining photoelectric conversion of light rays in a wide wavelength band can be constructed. Such a dye is preferably bis-type squarylium cyanine dye, which has a peak wavelength of IPCE near 800 nm. The dye 2b may be adsorbed on to the porous first-conductive-type transporter 2a by, for example but without limitation, immersing the electroconductive substrate 11 on which the first-conductive-type transporter 2a is formed into a solution wherein the dye 2b is dissolved. Other examples of the material of the dye 2b may include, without limitation, metal complex dyes, organic dyes, organic pigments, inorganic dyes, inorganic pigments, and inorganic semiconductors, and the like.

The second-conductive-type transporter 2c transports electric charges (for example, holes) from the dye 2b. The second-conductive-type transporter 2c may be, for example but without limitation, a semiconductor, a liquid electrolyte, a gel electrolyte, a solid electrolyte, a melted salt, an organic hole-transporting agent, or the like. The liquid electrolyte may be, for example but without limitation, a solution wherein a quaternary ammonium salt, a Li salt or the like is dissolved in a solvent. The composition of the electrolytic solution is a composition prepared by incorporating, into an organic solvent, tetrapropylammonium iodide, lithium iodide, iodine or the like. The gel electrolyte is preferably, for example, a gel electrolyte obtained by incorporating a host polymer into an organic solvent, and then polymerizing a monomer. The solid electrolyte is preferably a solid electrolyte wherein a polymeric chain has a salt such as a sulfoneimidazolium salt, a tetracyanoquinodimethane salt or a dicyanoquinodiimine salt.

For example, when the first-conductive-type transporter $2a$ is porous, it is preferred to use the second-conductive-type transporter $2c$ having permeability. Here in a phrase "transporter $2c$ having permeability" means that the transporter $2c$ is formed to be embedded in the pores in the porous first-conductive-type transporter $2a$. The second-conductive-type transporter $2c$ having permeability is preferably, without limitation, a liquid electrolyte, a gel electrolyte, a solid electrolyte, or the like.

The electroconductive substrate 11 removes electric currents generated in a second photoelectric converter 2 and a first photoelectric converter 6, and furthermore functions as a structural support for the second photoelectric converter 2 and first photoelectric converter 6. The electroconductive substrate 11 may be made from, for example but without limitation, a thin metallic sheet. Preferred examples of raw materials for the electroconductive substrate 11 include, without limitation, titanium, stainless steel, aluminum, silver, copper, nickel, and the like. Other examples of raw materials of the electroconductive substrate 11 include, without limitation, resin impregnated with carbon, resin impregnated with fine metallic particles, resin impregnated with fine wire particles made of metal, and electroconductive resin.

The electroconductive substrate 11 may have a structure wherein an electroconductive film $11b$ is formed on an insulating substrate $11a$. The electroconductive film $11b$ may comprise, for example but without limitation, a thin metallic film, a metal oxide electroconductive film, or an electroconductive layer film laminated to each other, and the like. The electroconductive film $11b$ may comprise, for example but without limitation, a silver film, or an adhesive-layer-attached laminated film made of a Ti layer, a Ag layer and a Ti layer, and the like. The insulating substrate $11a$ may comprise, for example, resin material, inorganic material, and/or organic/inorganic hybrid material, and the like.

The electroconductive substrate 11 may reflect light, whereby the light 18 transmitted through the photoelectric conversion device 1 is reflected back through the photoelectric conversion device 1 for additional photoelectric conversion. The electroconductive substrate 11 may also be translucent (e.g., a glass plate to which a $SnO_2$:F (F-doped $SnO_2$) film is attached), and a light-reflective sheet, film or member may be formed on a rear surface of the electroconductive substrate 11. For high reflectivity, the electroconductive substrate 11 or the light-reflective sheet, film or member formed on the electroconductive substrate 11 may be made of, for example but without limitation, a metal such as silver, aluminum or the like.

A heat sink plate or the like may be attached to the rear surface of the electroconductive substrate 11. This makes it possible to cool the dye-sensitized photoelectric converter 2 easily through the electroconductive substrate 11 so that a rise in the temperature of the dye-sensitized photoelectric converter 2 can be restrained. As a result, a thermal deterioration of the dye can be restrained. For reference, the heat sink plate or the like may not have translucency since light is not required to be radiated into the combined photoelectric conversion device from the dye-sensitized photoelectric converter 2 side thereof.

Figure 2:
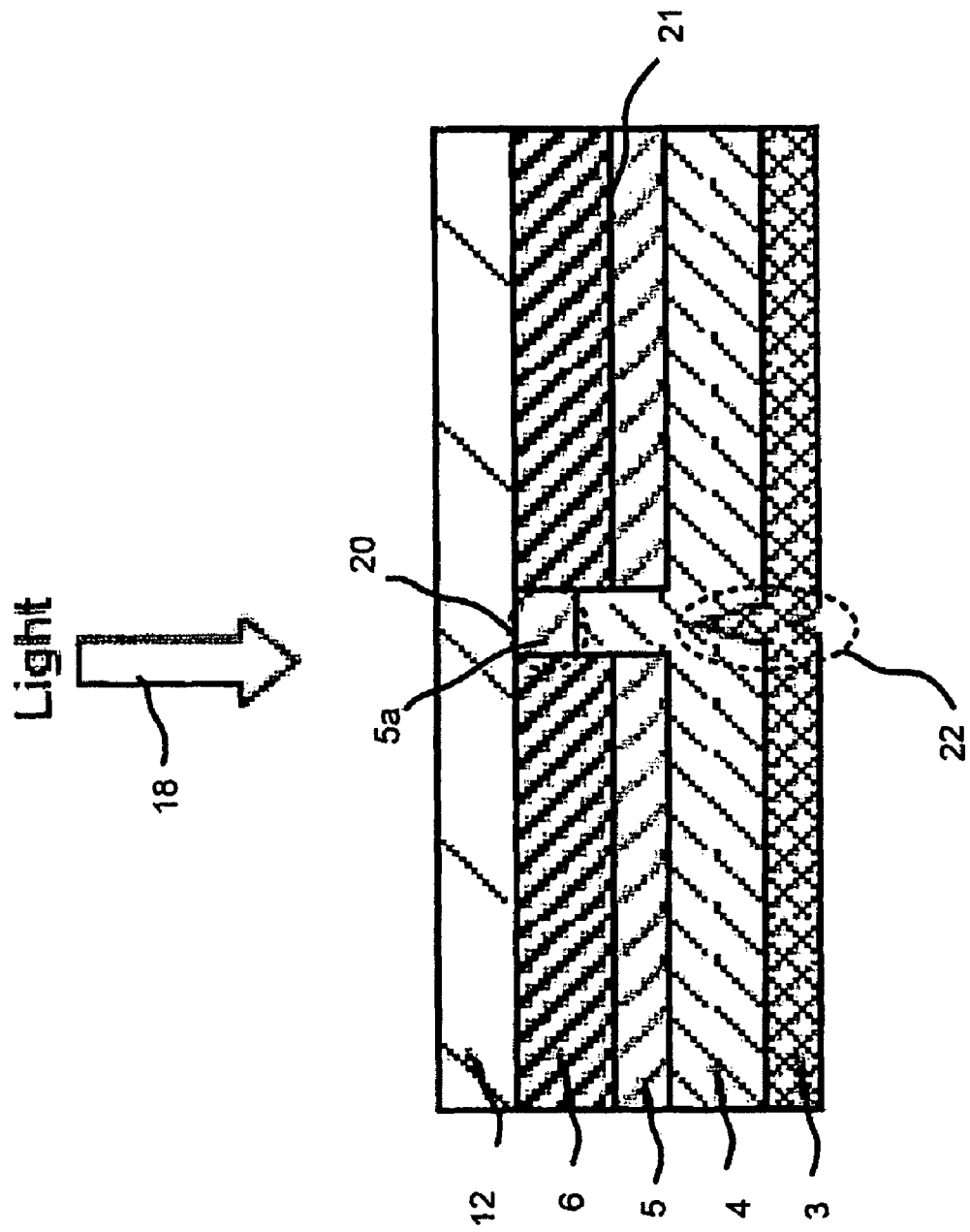
FIG. 2 is a sectional view illustrating a pinhole defect present in the combined photoelectric conversion device of FIG. 1 according to an embodiment of the disclosure.

FIG. 2 is a sectional view illustrating a pinhole(s) 20 defect present in the combined photoelectric conversion device of FIG. 1 according to an embodiment of the disclosure. When the first photoelectric converter 6 is a thin-film photoelectric converter or the like, then during manufacturing of the first photoelectric converter 6, one or more pinholes 20 may be formed due to, for example, a manufacturing defect 22. These pinholes 20 may cause leakage current as explained below. By making the first electroconductive layer 5 thinner than the first photoelectric converter 6 and including a high-resistivity second electroconductive layer 4, an effect of leakage current caused by the one or more pinholes 20 can be restrained. For example, in order to take out electric charges effectively from the first photoelectric converter 6, it is preferred to form the first electroconductive layer 5 on a lower surface 21 (opposite the side of the incoming light 18) of the first photoelectric converter 6. However, when pinholes 20 occur in the first photoelectric converter 6, formation of the first electroconductive layer 5 in the pinholes 20 can cause a short circuit between the first electroconductive layer 5 and the translucent electroconductive layer 12. This is because a portion $5a$ connected (connection not shown) to first electroconductive layer 5 forms a connection to the translucent electroconductive layer 12. The short circuit may cause a leakage current causing the photoelectric conversion efficiency of the first photoelectric converter 6 to be low.

In the embodiment shown in FIG. 2, if the first photoelectric converter 6 is thicker than the first electroconductive layer 5, and the first electroconductive layer 5 only partially fills the pinhole 20. The portion $5a$ of the first electroconductive layer 5 can be disconnected (orphaned) from the first electroconductive layer 5. The high-resistivity second electroconductive layer 4 fills the remainder of the pinhole 20, and thus blocks a connection from the first electroconductive layer 5 and the translucent electroconductive layer 12. In this manner, the pinhole 20 does not cause a significant leakage current and thus the efficiency of the first photoelectric converter 6 remains high or improves.

The thickness of the first electroconductive layer 5 is preferably at most 60% of the thickness of the first photoelectric converter 6, more preferably at most 30% thereof in order to further restrain the short circuits based on pinholes 20. Moreover, the thickness of the first electroconductive layer 5 is preferably at least about 0.5 nm in order to raise the occupation ratio of the first electroconductive layer 5 in a surface of the first photoelectric converter 6 to take out electric charges satisfactorily.

Therefore, the pinholes 20 present in the first photoelectric converter 6 are not completely filled with the first electroconductive layer 5 so that the first electroconductive layer 5 becomes discontinuous in regions (portion $5a$) of the pinholes 20. As a result, the short circuit can be restrained. On the other hand, electric charges can be satisfactorily transferred from the first photoelectric converter 6 to the second photoelectric converter 2 through the first electroconductive layer 5, the high-resistivity second electroconductive layer 4 and the third electroconductive layer 3 in regions other than the pinholes 20. In this manner, the short circuit caused by the pinholes 20 is restrained, while the efficiency of taking out electric charges from the first photoelectric converter 6 is maintained or improved.

Figure 3:
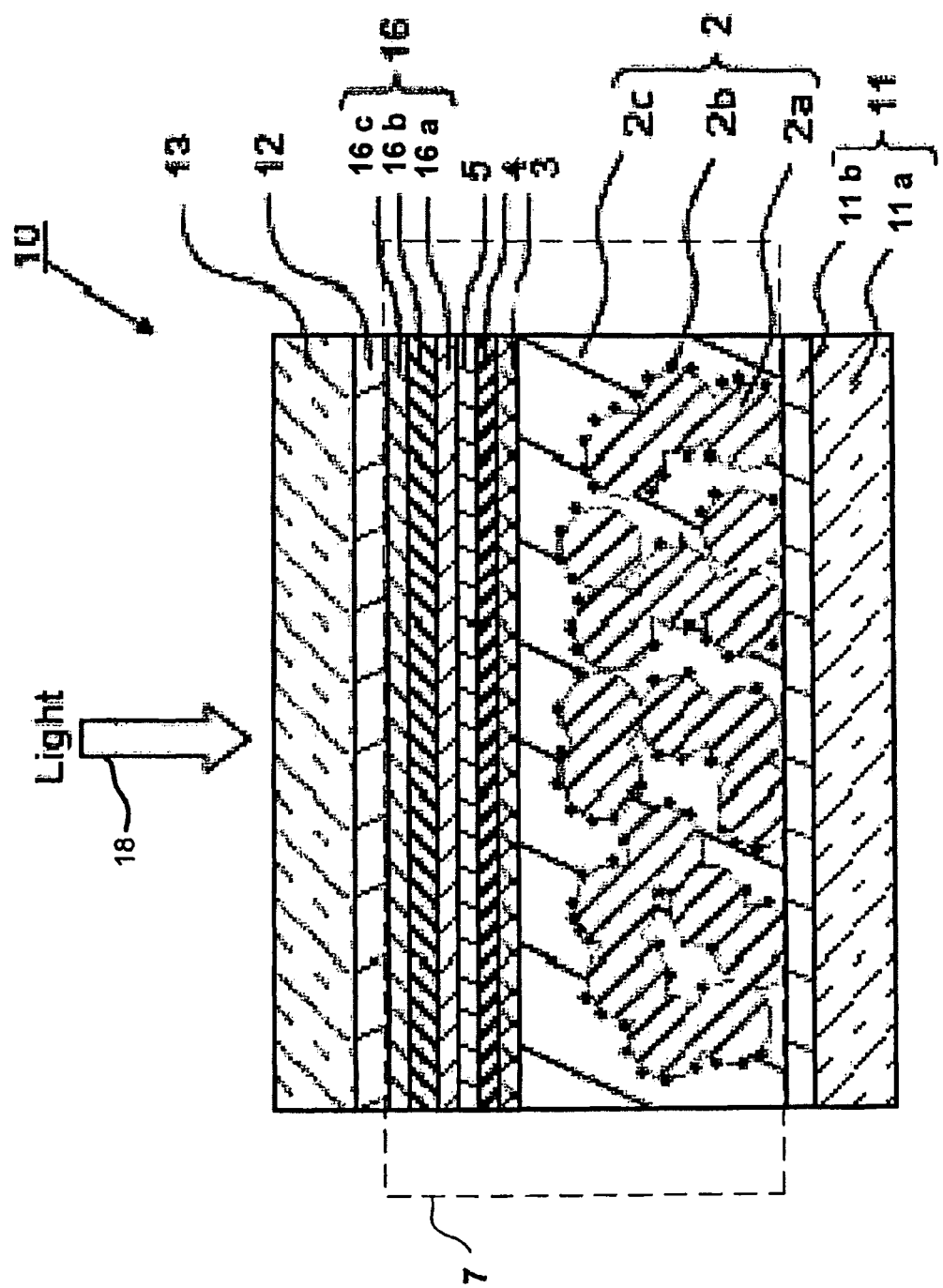
FIG. 3 is a sectional view illustrating an exemplary combined photoelectric conversion device according to an embodiment of the disclosure.

FIG. 3 is a sectional view illustrating an exemplary combined photoelectric conversion device 10 (device 10) according to an embodiment of the disclosure. A combined photoelectric conversion device 10 may share same definitions and functionalities as explained above in the context of FIG. 1, therefore these definitions and the functionalities may not be redundantly explained herein. Device 10 includes a first photoelectric converter 16 (non-monocrystalline photoelectric converter layer) instead of the first photoelectric converter (thin-film photoelectric converter) 6 in the combined photoelectric conversion device 1 (FIG. 1). The first photoelectric converter 16 comprises the following three layers: a first-conductive-type (for example, n type) silicon based semiconductor layer 16a, an intrinsic amorphous silicon based semiconductor layer 16b, which is substantially intrinsic (i type), and a second-conductive-type (for example, p type) silicon based semiconductor layer 16c. A dye 2b has a peak sensitivity to a longer wavelength than the wavelengths to which amorphous silicon based semiconductors have peak sensitivities.

Since the first photoelectric converter 16 has a PIN structure having the i type amorphous silicon layer, the combined photoelectric conversion device 10 can generate electric power with a high open circuit voltage of about 0.9 V in a relatively narrow visible-ray range extending to a wavelength of about 700 nm. This produces an advantage that outputted power is large when the first photoelectric converter 16 attains photoelectric conversion. Moreover, the i type amorphous silicon layer sufficiently absorbs ultraviolet rays and blue light rays; therefore, the radiation of light into the dye-sensitized photoelectric converter, which is the second photoelectric converter 2, is decreased so that an optical deterioration of the dye-sensitized photoelectric converter, which contains the organic substance, can be restrained.

The non-monocrystalline photoelectric converter layer 16 of the pin structure, which has the i-type amorphous silicon layer, is preferably a hydrogenated amorphous silicon based semiconductor layer having a pin junction and obtained by continuous deposition according to plasma CVD. A p-type semiconductor layer may be arranged on the first electroconductive layer 5 side. Conversely, an n type semiconductor layer may be arranged on the first electroconductive layer 5 side.

Specific examples of the non-monocrystalline photoelectric converter layer 16 of the pin structure, which has the i type amorphous silicon layer, will be described hereinafter. The second-conductive-type silicon based semiconductor layer 16c may be a p type a-Si:H (H-doped amorphous silicon) layer, and the thickness thereof ranges preferably from about 50 Å to about 200 Å, more preferably from about 80 Å to about 120 Å. The thickness of at least about 50 Å is preferred for forming an internal electric field satisfactorily, and the thickness of about 200 Å or less is preferred for making optical loss small.

The intrinsic amorphous silicon based semiconductor layer 16b may be, without limitation, an i type a-Si:H layer, and the thickness thereof preferably ranges from about 500 Å to about 5000 Å (about 0.05 μm to about 0.5 μm), more preferably from about 1500 Å to about 2500 Å (about 0.15 μm to about 0.25 μm). The thickness of about 500 Å or more is preferred for obtaining photoelectric currents satisfactorily. The thickness of about 5000 Å or less is preferred for causing light to be satisfactorily transmitted through the dye-sensitized photoelectric converter 2.

The first-conductive-type silicon based semiconductor layer 16a may be, without limitation, an n type a-Si:H layer, and the thickness thereof ranges preferably from 50 to 200 Å, more preferably from about 80 Å to about 120 Å. The thickness of at least about 50 Å is preferred for forming an internal electric field satisfactorily, and the thickness of at most about 200 Å is preferred for making optical loss small.

For example, when the i type semiconductor layer 16b is amorphous, at least one of the p type semiconductor layer 16c and the n type semiconductor layer 16a may be a layer having fine crystals or a hydrogenated amorphous silicon alloy based layer. For example, the p type semiconductor layer 16c, on the light-incident side (reference 18 in FIG. 3), is more preferably a layer made of hydrogenated amorphous silicon carbide since the translucency can be made high so that optical loss is small.

Figure 4:
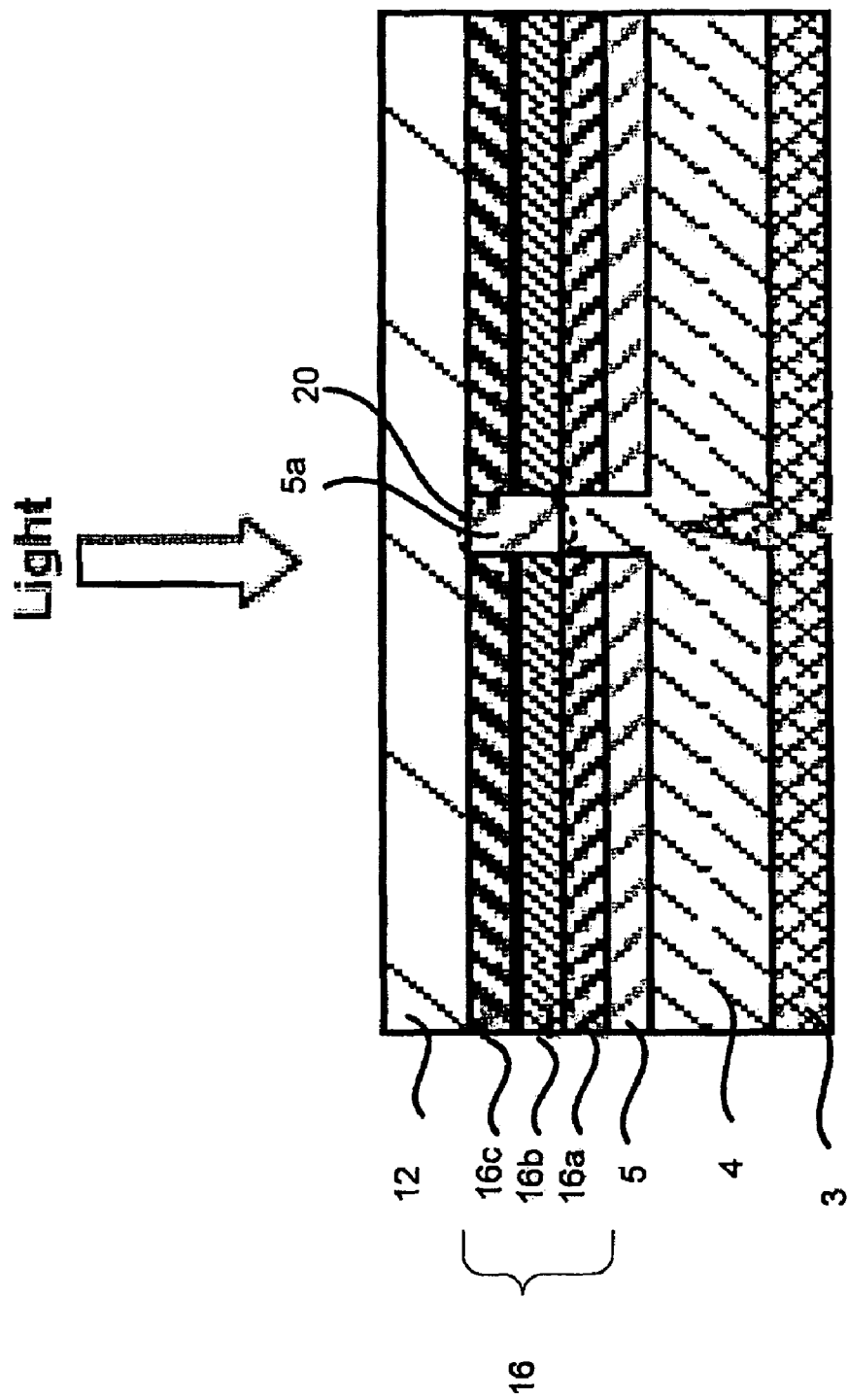
FIG. 4 is a sectional view illustrating a pinhole defect present in the combined photoelectric conversion device of FIG. 3 according to an embodiment of the disclosure.

FIG. 4 is a sectional view illustrating a pinhole 20 defect present in the combined photoelectric conversion device of FIG. 3 according to an embodiment of the disclosure. When the first photoelectric converter 16 is made of a pin junction type or pn junction type semiconductor, the first electroconductive layer 5 formed in the pinholes 20 may cause an electric connection between the n type semiconductor and the p type semiconductor. Even in such a case, the photoelectric conversion efficiency hardly falls unless the first electroconductive layer 5 formed on a surface of the first photoelectric converter 16 is electrically connected to the first electroconductive layer 5 formed in the pinholes 20. In other words, carriers generated in the first photoelectric converter 16 are almost immediately transferred to the surface of the first photoelectric converter 16 so that a very small amount of the carriers is transferred in the layer direction so as to reach the pinholes 20. Thus, an effect of the first electroconductive layer 5 in the pinholes 20 onto the photoelectric conversion efficiency is small.

In one embodiment, the first electroconductive layer 5 is thinner than the first photoelectric converter 16; therefore, in the pinholes 20 in the first photoelectric converter 16, the first electroconductive layer 5 formed on the surface of the first photoelectric converter 16 and the portion 5a of first electroconductive layer 5 formed in the pinholes 20 can be made discontinuous (disconnected from first electroconductive layer 5). Thus, even when the first photoelectric converter 16 is a pn junction type or pin junction type semiconductor, a fall in the photoelectric conversion efficiency can be effectively restrained.

The first electroconductive layer 5 is preferably rendered a lamellar body wherein through holes are made, or a discontinuous layer composed of dotted islands. In this manner, it is less likely that the first electroconductive layer 5 is formed in the pinholes 20 in the first photoelectric converter 16. Thus, the short circuit caused by the pinholes 20 is restrained more effectively.

For example, when the second photoelectric converter 2 is a thin-film photoelectric converter, the thickness of the third electroconductive layer 3 is made thinner than that of the second photoelectric converter 2 in the same manner as the first electroconductive layer 5.

Examples of the combined photoelectric conversion device according to various embodiments of the disclosure are described hereinafter. For a first example, a glass substrate was prepared as a translucent cover. The glass substrate of size: about 10 cm×10 cm having a translucent electroconductive layer ($SnO_2$:F (FTO) film, sheet resistivity: 10Ω/□) was used. Next, a plasma CVD apparatus was used to deposit, on the translucent cover, a p type a-Si:H layer as a second-conductive-type silicon based semiconductor layer, an i type a-Si:H layer as an intrinsic amorphous silicon based semiconductor layer, and an n type a-Si:H layer as a first-conductive-type silicon based semiconductor layer and continuously in a vacuum by a method described below. In the formation of each of the p type a-Si:H layer, the i type a-Si:H layer, and the n type a-Si:H layer, the temperature of the glass substrate was set to about 200° C. The p type a-Si:H layer was deposited into a thickness of about 100 Å by using $SiH_4$ gas and $B_2H_6$ gas (diluted with $H_2$) as layer-forming gases and setting the flow rates of these gases to about 2.7 sccm and about 18 sccm, respectively. The i type a-Si:H layer was deposited into a thickness of about 1400 Å by using $SiH_4$ gas and $H_2$ as layer-forming gases and setting the flow rates of these gases to about 5 sccm and about 20 sccm, respectively. The n type a-Si:H layer was deposited into a thickness of about 200 Å by using SiH4 gas, H2 and PH3 (diluted with H2) as layer-forming gases and setting the flow rates of these gases to about 3 sccm, about 30 sccm and about 6 sccm, respectively.

Next, a sputtering apparatus was used to deposit a Pt layer as a first electroconductive layer into a thickness of about 0.001 μm on the n type a-Si:H layer. Next, a In2O3:Sn layer was formed as a second electroconductive layer thereon. This second electroconductive layer was formed into a thickness of about 0.075 μm by use of the sputtering apparatus. At this time, argon gas and 20%-oxygen-mixed argon gas were simultaneously introduced at about 10 sccm and about 10 sccm, respectively, so as to perform the sputtering. Next, a Pt layer was deposited as a third electroconductive layer thereon into a thickness of about 0.001 μm. Concurrently, in order to prepare a sample for measuring the sheet resistivity of the high-resistivity second electroconductive layer 4, the same first electroconductive layer 5, high-resistivity second electroconductive layer 4 and third electroconductive layer 3 as described above were formed on a dummy substrate made of glass by sputtering. The sheet resistivity of the laminated films formed on this dummy substrate by the sputtering was about 107 Ω/□.

Next, as an electroconductive substrate (electroconductive sheet), prepared was a glass substrate (size: about 1 cm×2 cm) having a translucent electroconductive layer (FTO film, sheet resistivity: 10Ω/□). Next, a porous TiO2 layer was formed as a first-conductive-type transporter (electron transporter) on the electroconductive substrate as follows: first, a paste was prepared, wherein anatase powder of TiO2 was sufficiently dispersed together additives in a-terpineol; this was printed on a main face of the electroconductive substrate and the substrate was fired at 450° C. for 30 minutes; and the printing and firing were repeated to form the porous TiO2 layer.

Next, a black dye colorant (manufactured by Solaronix SA) was used as a dye, and an ethanol solvent was used as a solvent used to dissolve the dye. Thereto was added deoxycholic acid as a co-adsorbent. The electroconductive substrate, on which the TiO2 layer was formed, was immersed into the solution wherein the dye was dissolved to carry the dye onto the TiO2 layer. The period for the immersion was 24 hours, and the temperature of the electroconductive substrate was from about 24 to about 27° C.

The thus-prepared FTO-film-attached glass substrate on which the translucent electroconductive layer, the a-Si:H layer and so on were laminated, and the thus-prepared FTO-film-attached glass substrate on which dye-carried porous TiO2 layer was formed were caused to adhere lightly onto each other so as to give a gap of 50 μm therebetween and sandwich a resin therebetween. A liquid electrolyte described below was incorporated into the TiO2 layer to produce a combined photoelectric conversion device. As a hole transporter (electrolyte), the following was used: a solution prepared by adding acetonitrile tert-butylpyridine (TBP) to iodine (I2), lithium iodide (LiI) and dimethylpropylimidazolium iodide (DMPII) as liquid electrolytes.

The resultant combined photoelectric conversion device exhibited a photoelectric conversion efficiency of about 9.92% at about 100 mW/cm2 under AM 1.5.

For the second example, a translucent electroconductive layer and a p type a-Si:H layer were laminated on an FTO-film-attached glass substrate in the same way as in the first example. An i type a-Si:H layer was formed thereon. The i type a-Si:H layer was deposited into a thickness of about 1000 Å by using SiH4 gas and H2 gas as layer-forming gases and setting the flow rates of these gases to about 5 sccm and about 20 sccm, respectively. Next, an n type a-Si:H layer was formed thereon in the same way as in the first example.

Next, a sputtering apparatus was used to deposit a Pt layer as a first electroconductive layer into a thickness of about 0.001 μm on the n type a-Si:H layer. Next, a TiO2:Nb layer was formed as a second electroconductive layer thereon. This high-resistivity second electroconductive layer 4 was formed into a thickness of about 0.015 μm by use of the sputtering apparatus. At this time, argon gas and about 20%-oxygen-mixed argon gas were simultaneously introduced at about 94 sccm and about 5 sccm, respectively, so as to perform the sputtering. Furthermore, a Pt layer was deposited as a third electroconductive layer thereon into a thickness of about 0.001 μm. Concurrently, in order to prepare a sample for measuring the sheet resistivity of the high-resistivity second electroconductive layer 4, the same first electroconductive layer 5, high-resistivity second electroconductive layer 4 and third electroconductive layer 3 as described above were formed on a dummy substrate made of glass (thickness: about 0.7 mm) by sputtering. The sheet resistivity of the laminated films formed on this dummy substrate by the sputtering was about 107 Ω/□.

Next, an FTO-film-attached glass substrate wherein a dye-carried porous TiO2 layer was formed was produced in the same way as in the first example. In the same way as in the first example, a combined photoelectric conversion device was produced, using the above-mentioned FTO-film-attached glass substrate wherein the i type a-Si:H layer and the others were laminated and the FTO-film-attached glass substrate wherein the dye-carried porous TiO2 layer was formed. The photoelectric conversion efficiency thereof and other properties thereof were evaluated.

The resultant combined photoelectric conversion device exhibited a photoelectric conversion efficiency of about 9.97% at about 100 mW/cm2 under AM 1.5.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A combined photoelectric conversion device comprising a laminated structure comprising:
   a first photoelectric converter comprising a thin-film photoelectric converter;
   a first conductive layer thinner than the first photoelectric converter;
   a second conductive layer comprising a material higher in electric resistivity than the first conductive layer;
   a second photoelectric converter, and
   a third conductive layer located between the second conductive layer and the second photoelectric converter, wherein the third conductive layer comprises a material lower in electric resistivity than the second conductive layer.

2. The photoelectric conversion device according to claim 1, wherein the second conductive layer has a sheet resistivity of at least about 103Ω/ and at most about 1010Ω/□.

3. The photoelectric conversion device according to claim 2, wherein the second conductive layer is translucent.

4. The photoelectric conversion device according to claim 2, wherein the second conductive layer comprises at least one of the group consisting of: TiO2:Nb, In2O3:Sn, In2O3, SnO2, SnO2:F, SnO2:Sb, ZnO, ZnO:Ga, ZnO:Al, and ZnO:B.

5. The photoelectric conversion device according to claim 1, wherein the first conductive layer comprises at least one of the group consisting of: a platinum group element, an alloy of platinum group elements, aluminum, silver, carbon, and a conductive polymer.

6. The photoelectric conversion device according to claim 5, wherein the conductive polymer comprises at least one of the group consisting of: a thiophene derivative, a carbazole derivative, and an aniline derivative.

7. The photoelectric conversion device according to claim 1, wherein one of the first photoelectric converter and second photoelectric converter is a translucent photoelectric converter, and the other thereof has a spectral sensitivity to light transmitted through a translucent photoelectric converter.

8. The photoelectric conversion device according to claim 7, wherein a peak wavelength of a first spectral sensitivity of the first photoelectric converter is different from a peak wavelength of a second spectral sensitivity of the second photoelectric converter.

9. The photoelectric conversion device according to claim 1, wherein the second photoelectric converter is a dye-sensitized photoelectric converter comprising an electrolyte.

10. The photoelectric conversion device according to claim 9, further comprising a conductive substrate on a surface of the second photoelectric converter.

11. The photoelectric conversion device according to claim 1, wherein the thin-film photoelectric converter comprises an amorphous layer.

12. The photoelectric conversion device according to claim 11, wherein the amorphous layer comprises an i-type amorphous silicon layer.

13. The photoelectric conversion device according to claim 1, wherein the thin-film photoelectric converter is translucent.

14. The photoelectric conversion device according to claim 1, further comprising a translucent conductive layer on a surface of the first photoelectric converter.

15. A combined photoelectric conversion device comprising a laminated structure comprising:
   a first photoelectric converter comprising a pinhole;
   a first conductive layer thinner than the first photoelectric converter;
   a second conductive layer comprising a material higher in electric resistivity than the first conductive layer;
   a second photoelectric converter, and
   a third conductive layer located between the second conductive layer and the second photoelectric converter, wherein the third conductive layer comprises a material lower in electric resistivity than the second conductive layer.

16. The photoelectric conversion device according to claim 15, wherein the first photoelectric converter is a thin-film photoelectric converter.

* * * * *